US009343440B2

(12) United States Patent
McDonald et al.

(10) Patent No.: US 9,343,440 B2
(45) Date of Patent: May 17, 2016

(54) STACKED COMPOSITE DEVICE INCLUDING A GROUP III-V TRANSISTOR AND A GROUP IV VERTICAL TRANSISTOR

(75) Inventors: Tim McDonald, Redondo Beach, CA (US); Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 13/434,412

(22) Filed: Mar. 29, 2012

(65) Prior Publication Data
US 2012/0256189 A1 Oct. 11, 2012

Related U.S. Application Data

(60) Provisional application No. 61/473,907, filed on Apr. 11, 2011.

(51) Int. Cl.
*H01L 25/07* (2006.01)
*H03K 17/567* (2006.01)

(52) U.S. Cl.
CPC ............ *H01L 25/074* (2013.01); *H03K 17/567* (2013.01); *H01L 2224/48091* (2013.01); *H01L 2924/1305* (2013.01); *H01L 2924/13055* (2013.01); *H01L 2924/13091* (2013.01); *H01L 2924/30107* (2013.01)

(58) Field of Classification Search
CPC ..... H01L 27/085; H01L 29/20; H01L 27/088; H01L 21/98; H01L 23/52; H01L 2224/32145–2224/32148; H01L 2224/48145–2224/48149; H01L 25/065; H01L 25/0657; H01L 25/0652; H01L 25/074; H01L 2924/13055; H01L 2924/30107; H01L 2924/13091

USPC .............................. 257/76, 262; 438/109, 121
See application file for complete search history.

(56) References Cited

U.S. PATENT DOCUMENTS

| 3,648,131 | A | 3/1972 | Stuby | |
|---|---|---|---|---|
| 7,166,867 | B2 | 1/2007 | Beach | |
| 7,915,645 | B2 * | 3/2011 | Briere | ............................ 257/195 |

(Continued)

FOREIGN PATENT DOCUMENTS

| EP | 2 256 799 A2 | 12/2010 |
|---|---|---|
| EP | 2256799 | 12/2010 |

(Continued)

OTHER PUBLICATIONS

U.S. Appl. No. 61/448,617, filed Mar. 2, 2011, Lin.

(Continued)

*Primary Examiner* — Evan Pert
*Assistant Examiner* — Damon Hillman
(74) *Attorney, Agent, or Firm* — Farjami & Farjami LLP

(57) ABSTRACT

In one implementation, a stacked composite device comprises a group IV vertical transistor and a group III-V transistor stacked over the group IV vertical transistor. A drain of the group IV vertical transistor is in contact with a source of the group III-V transistor, a source of the group IV vertical transistor is coupled to a gate of the group III-V transistor to provide a composite source on a bottom side of the stacked composite device, and a drain of the group III-V transistor provides a composite drain on a top side of the stacked composite device. A gate of the group IV vertical transistor provides a composite gate on the top side of the stacked composite device.

20 Claims, 6 Drawing Sheets

(56) References Cited

U.S. PATENT DOCUMENTS

| | | | |
|---|---|---|---|
| 8,018,056 B2* | 9/2011 | Hauenstein | 257/730 |
| 8,847,408 B2 | 9/2014 | Lin | |
| 2003/0057459 A1 | 3/2003 | Rumennik | |
| 2003/0151064 A1 | 8/2003 | Ohno | |
| 2003/0155644 A1 | 8/2003 | Hirao | |
| 2005/0001235 A1 | 1/2005 | Murata | |
| 2007/0262346 A1 | 11/2007 | Otremba | |
| 2008/0191216 A1 | 8/2008 | Machida | |
| 2009/0008679 A1 | 1/2009 | Saito | |
| 2009/0051043 A1* | 2/2009 | Wong et al. | 257/777 |
| 2009/0057872 A1 | 3/2009 | Ehlers | |
| 2009/0108467 A1 | 4/2009 | Otremba | |
| 2009/0189191 A1 | 7/2009 | Sato | |
| 2009/0256196 A1 | 10/2009 | Wang | |
| 2009/0278167 A1 | 11/2009 | Ozoe | |
| 2010/0012934 A1 | 1/2010 | Jung | |
| 2010/0019397 A1 | 1/2010 | Youn | |
| 2010/0140805 A1 | 6/2010 | Chang | |
| 2010/0155932 A1 | 6/2010 | Gambino | |
| 2010/0259201 A1 | 10/2010 | Kawano | |
| 2010/0289092 A1 | 11/2010 | Pering | |
| 2010/0301396 A1* | 12/2010 | Briere | 257/195 |
| 2011/0049580 A1* | 3/2011 | Lui et al. | 257/262 |
| 2011/0095367 A1 | 4/2011 | Su | |
| 2011/0136325 A1 | 6/2011 | Briere | |
| 2011/0169549 A1 | 7/2011 | Wu | |
| 2012/0028436 A1* | 2/2012 | Or-Bach et al. | 438/401 |
| 2012/0193785 A1 | 8/2012 | Lin | |
| 2012/0223322 A1 | 9/2012 | Lin | |
| 2012/0256188 A1 | 10/2012 | McDonald | |
| 2012/0256189 A1 | 10/2012 | McDonald | |
| 2012/0256190 A1 | 10/2012 | McDonald | |
| 2012/0274366 A1 | 11/2012 | Briere | |
| 2013/0175542 A1 | 7/2013 | Briere | |
| 2013/0240898 A1 | 9/2013 | Briere | |
| 2014/0035005 A1 | 2/2014 | Briere | |
| 2014/0225162 A1 | 8/2014 | Briere | |

FOREIGN PATENT DOCUMENTS

| | | |
|---|---|---|
| EP | 2639829 A2 | 9/2013 |
| EP | 2639832 A2 | 9/2013 |
| JP | S 62-52954 | 3/1987 |
| JP | H 10-163333 | 6/1998 |
| JP | 2006-351691 | 12/2006 |
| JP | 2007/048842 A | 2/2007 |
| JP | H 11-3916 | 1/2011 |
| WO | WO 2008/116038 | 9/2008 |

OTHER PUBLICATIONS

U.S. Appl. No. 61/448,347, filed Mar. 2, 2011, Lin.
U.S. Appl. No. 61/473,907, filed Apr. 11, 2011, McDonald.
U.S. Appl. No. 61/611,369, filed Mar. 15, 2012, McDonald.
U.S. Appl. No. 13/433,864, filed Mar. 29, 2012, McDonald.
U.S. Appl. No. 13/434,524, filed Mar. 29, 2012, McDonald.
U.S. Appl. No. 13/780,436, filed Feb. 28, 2013, Briere.
U.S. Appl. No. 13/781,080, filed Feb. 28, 2013, Briere.
European Search Report on European Patent Application No. EP 10 00 4470.

\* cited by examiner

STACKED COMPOSITE DEVICE INCLUDING A GROUP III-V TRANSISTOR AND A GROUP IV VERTICAL TRANSISTOR

The present application claims the benefit of and priority to a provisional application entitled "Group III-Nitride and Group IV Composite Device," Ser. No. 61/473,907 filed on Apr. 11, 2011. The disclosure in this provisional application is hereby incorporated fully by reference into the present application.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride" or "III-N" refers to a compound semiconductor that includes nitrogen and at least one group III element including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar or non-polar crystal orientations. A III-Nitride material may also include either the Wurtzitic, Zincblende or mixed polytypes, and may include single-crystal, monocrystalline, polycrystalline, or amorphous structures.

Also as used herein, the phrase "group IV" refers to a semiconductor that includes at least one group four element including silicon (Si), germanium (Ge) and carbon (C), and also includes compound semiconductors such as silicon germanium (SiGe) and silicon carbide (SiC), for example. Group IV also refers to semiconductor materials which include more than one layer of group IV elements, or doping of group IV elements to produce strained group IV material, and may also include group IV based composite substrates such as silicon on insulstor (SOI), separation by implantation of oxygen (SIMOX) process substrates, and silicon on sapphire (SOS), for example.

Moreover, and as also used herein, the phrase "LV device" refers to a low-voltage device. Typical voltage ratings include LV~0V-50V, midvoltage (MV)~50V-300V, and high-voltage (HV)~300V-1200V.

II. Background Art

In high power and high performance circuit applications, III-Nitride transistors, such as gallium nitride (GaN) field-effect transistors (FETs) and high mobility electron transistors (HEMTs), are often desirable for their high efficiency and high-voltage operation. Moreover, it is often desirable to combine such III-Nitride transistors with other FETs, such as silicon FETs, to create high performance composite switching devices.

In power management applications where normally OFF characteristics of power devices are desirable, a depletion mode (normally ON) III-Nitride transistor can be cascoded with an enhancement mode (normally OFF) low-voltage (LV) or midvoltage (MV) group IV semiconductor transistor, for example a silicon FET, to produce an enhancement mode (normally OFF) composite power device. However, conventional packaging techniques for combining III-Nitride transistors with silicon FETs, for example, often counterweigh the benefits provided by HI-Nitride devices. For instance, conventional package designs may place discrete components side-by-side on a common support surface implemented using a ceramic based substrate such as a direct bonded copper (DBC) substrate, or a ceramic substrate on a lead-frame. Such side-by-side configuration can undesirably increase the parasitic inductance and resistance in the current paths of the composite power device, and would also increase the thermal dissipation requirements of the package. Moreover, the side-by-side placement of devices on a common substrate can undesirably increase package form factor, as well as manufacturing costs.

SUMMARY

The present disclosure is directed to a stacked composite device including a group III-V transistor and a group IV vertical transistor, substantially as shown in and/or described in connection with at least one of the figures, and as set forth more completely in the claims.

DETAILED DESCRIPTION

Figure 1:
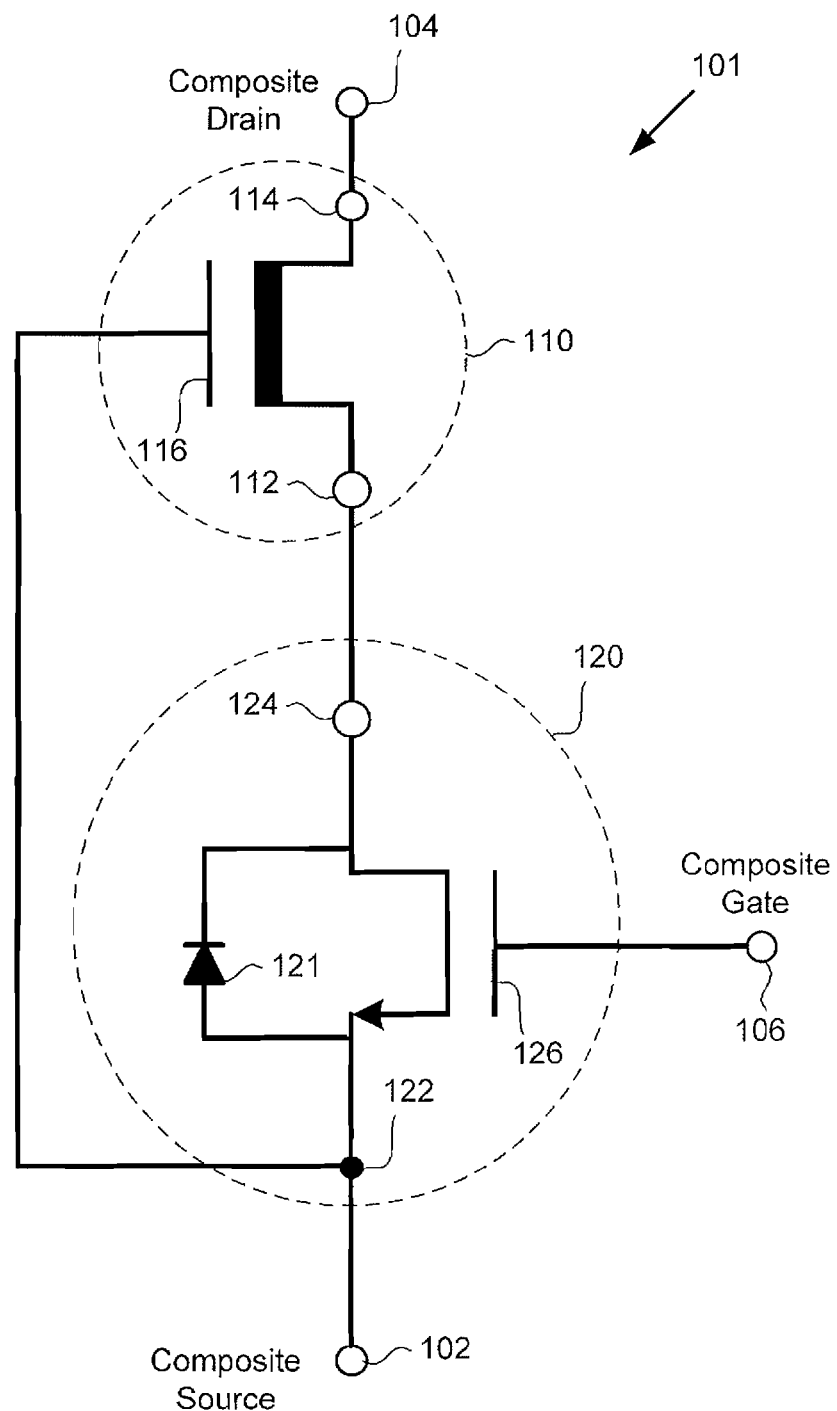
FIG. 1 presents a diagram representative of one exemplary implementation of a composite device.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

III-Nitride materials include, for example, gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields, high saturation velocities, and the creation of two-dimensional electron gases (2DEGs). As a result, III-Nitride materials such as GaN are used in many microelectronic applications as depletion mode (e.g., normally ON) and enhancement mode (e.g., normally OFF) power field-effect transistors (FETs) and high electron mobility transistors (HEMTs), for example.

In power management applications where normally OFF characteristics of power devices are required, a depletion mode III-Nitride or other group III-V device can be cascoded with a low-voltage (LV) or midvoltage (MV) group IV semiconductor device to produce an enhancement mode composite power device. However, the utility and reliability of such a composite device can be compromised by conventional packaging techniques for combining III-Nitride transistors with silicon or other group IV semiconductor FETs, which can often negate the benefits provided by III-Nitride devices. For example, and as noted above, conventional package designs may place discrete components side-by-side on a common support surface implemented using a ceramic based substrate such as a direct bonded copper (DBC) substrate, or a ceramic substrate on a lead-frame. Such side-by-side configuration can undesirably increase the parasitic inductance and resistance in the current paths of the composite power device, and would also increase the thermal dissipation requirements of the package. Moreover, the side-by-side placement of devices on a common substrate can undesirably increase package form factor, as well as manufacturing costs. As a result, a compact and cost-effective packaging solution for integrating III-Nitride or other group III-V transistors with group IV FETs, such as silicon FETs, is needed.

One approach to providing the needed packaging solution is implemented by the vertical stacking of the silicon or other group IV active die on top of the III-Nitride or other group III-V active die, as disclosed in U.S. patent application Ser. No. 13/053,646, entitled "III-Nitride Transistor Stacked with Diode in a Package," filed on Mar. 22, 2011; as well as in U.S. patent application Ser. No. 13/053,556, entitled: "III-Nitride Transistor Stacked with FET in a Package," also filed on Mar. 22, 2011, both of which are hereby incorporated by reference in their entirety.

The present application is directed to a stacked composite device wherein the group III-V active die is stacked on top of a silicon or group IV active die having a vertical transistor formed therein. The present approach is motivated in part by the larger die size typically required for the bottom die. That is to say, by implementing the bottom (larger) active die of the composite device using a less expensive group IV material such as silicon, and stacking a smaller active die formed of a costlier group III-V material such as GaN over the smaller group IV active die, the present application discloses a compact, cost effective packaging solution advantageously providing the performance advantages enabled by group III-V transistors.

According to one implementation, the stacked composite device may include a III-Nitride power transistor cascoded with an LV or MV group IV vertical transistor. The cascoded combination of the III-Nitride power transistor, which may be a normally ON device, for example, with the LV or MV group IV vertical transistor can be implemented to produce a normally OFF composite power device. Moreover, the composite device configurations disclosed by the present application are designed to substantially reduce parasitic inductance and resistance, and enhance thermal dissipation by a composite device package when compared to conventional integrated packaging solutions.

Referring to FIG. 1, FIG. 1 shows one exemplary implementation of a composite device. As shown in FIG. 1, composite device 101 includes group III-V transistor 110 cascoded with group IV transistor 120. Also shown in FIG. 1 are composite source 102, composite drain 104, and composite gate 106 of composite device 101, as well as source 112, drain 114, and gate 116 of group III-V transistor 110, and body diode 121, source 122, drain 124, and gate 126 of group IV transistor 120.

Group III-V transistor 110 may be a III-Nitride power transistor and may be implemented as an insulated-gate FET (IGFET), or as a heterostructure FET (HFET), for example. In one implementation, group III-V transistor 110 may take the form of a metal-insulator-semiconductor FET (MISFET), such as a metal-oxide-semiconductor FET (MOSFET). Alternatively, when implemented as an HFET, group III-V transistor 110 may be a HEMT configured to produce a 2DEG. According to one implementation, for example, group III-V transistor 110 may be a high-voltage (HV) device configured to sustain a drain voltage of approximately 600V and having a gate rating of approximately 40V. It is noted that in some implementations, composite device 101 may utilize an insulated gate bipolar transistor (IGBT) as a power transistor in place of a group III-V FET or HEMT. It is further noted that composite device 101 may utilize a group III-V FET or HEMT other than a III-N FET or HEMT, such as a III-As, III-P or III-$As_aP_bN_{(1-a-b)}$ FET or HEMT, for example, as group III-V transistor 110.

Group IV transistor 120 may be implemented as an LV or MV group IV vertical transistor, such as a silicon vertical transistor having a breakdown voltage in a range from approximately 25V to approximately 250V, for example. According to one implementation, group IV transistor 120 may be a silicon vertical MISFET or MOSFET, for example. However, in other implementations, group IV transistor 120 may include any suitable group IV material, such as silicon carbide (SiC), germanium (Ge), silicon germanium (SiGe), or a strained group IV element or compound, for example.

The cascoded combination of group transistor 110 and group IV transistor 120 produces composite device 101, which according to the implementation shown in FIG. 1 results in a composite three terminal device functioning in effect as a composite transistor having composite source 102 and composite gate 106 provided by group IV transistor 120, and composite drain 104 provided by group III-V transistor 110. Moreover, and as will be described in greater detail by reference to the exemplary implementations discussed below, composite device 101 may be configured so as to be contained by a compact package having reduced parasitic inductance and resistance, and enhanced thermal dissipation.

Figure 2A:
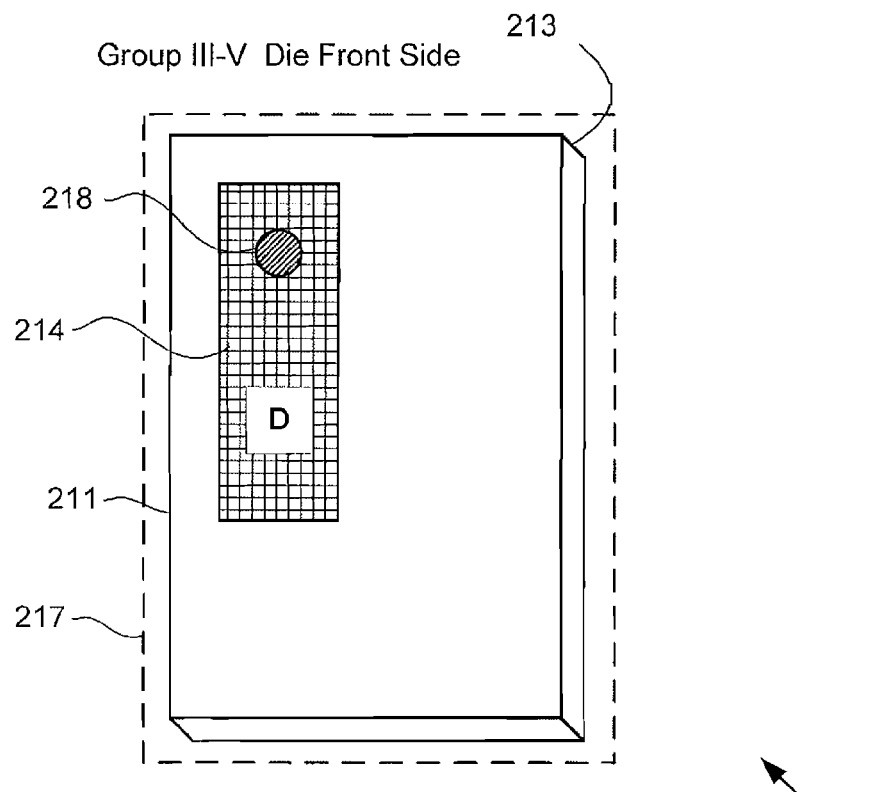
FIG. 2A presents a perspective view showing a front side of an exemplary group transistor suitable for use in a stacked composite device, according to one implementation.
Figure 2B:
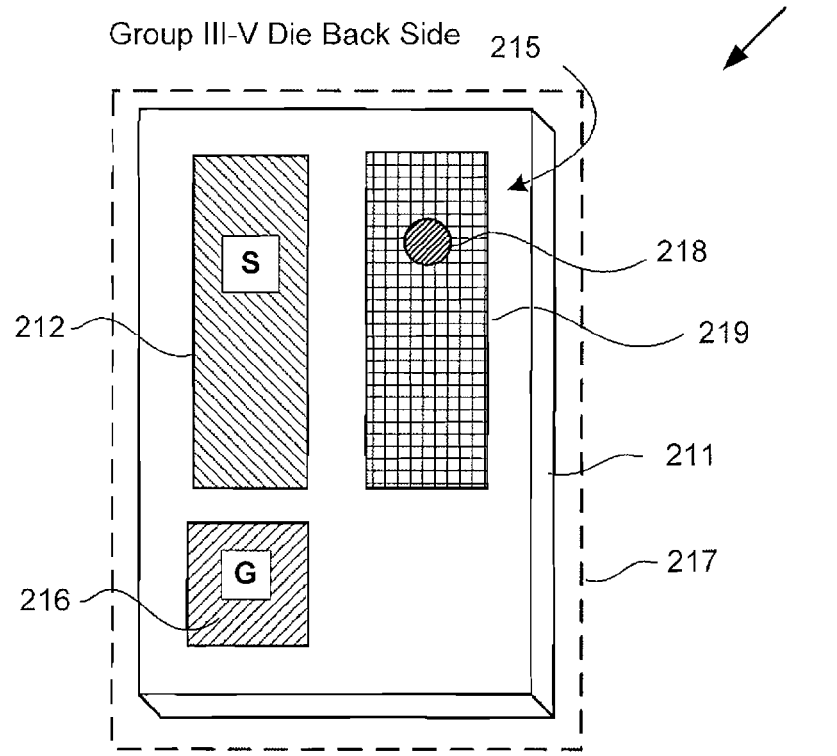
FIG. 2B presents a perspective view showing a back side of the exemplary group III-V transistor shown in FIG. 2A.

Continuing to FIGS. 2A and 2B, FIG. 2A presents a perspective view showing front side 213 of exemplary group III-V transistor 210 suitable for use in a stacked composite device, according to one implementation, while FIG. 2B presents a perspective view showing back side 215 of group III-V transistor 210. As shown by FIG. 2A, group III-V transistor 210 includes active die 211 having lateral area 217 and including drain electrode 214 formed on front side 213 of active die 211. Also shown in FIG. 2A is front side terminus of through-substrate via 218 electrically coupling drain electrode 214 to drain pad 219 on back side 215 of active die 211 (drain pad 219 and back side terminus of through-substrate via 218 shown in FIG. 2B). As further shown by FIG. 2B, source electrode 212, gate electrode 216, and drain pad 219 including back side terminus of through-substrate via 218 are formed on back side 215 of active die 211. It is noted that although the front side terminus of through-substrate via 218 is visually depicted as "seen through" drain electrode 214 in the interests of conceptual clarity, in practice the front side terminus of through-substrate via 218 would be obscured by the presence of drain electrode 214 and thus would not be visible from the perspective view shown by FIG. 2A. Similarly, the back side terminus of through-substrate via 218 visually depicted as "seen through" drain pad 219 on back side 215 of active die 211 would be obscured by the presence of drain pad 219 and thus would not be visible from the perspective view shown by FIG. 2B.

Active die 211 may be formed of a III-Nitride material, for example, and may be implemented as a HEMT power device. As noted above, drain pad 219 is coupled to drain electrode 214 by through-substrate via 218. Group III-V transistor 210 having source electrode 212, drain electrode 214, and gate electrode 216 corresponds to group III-V transistor 110 having source 112, drain 114, and gate 116, in FIG. 1, and may share any of the characteristics previously attributed to that corresponding device above.

Figure 3A:
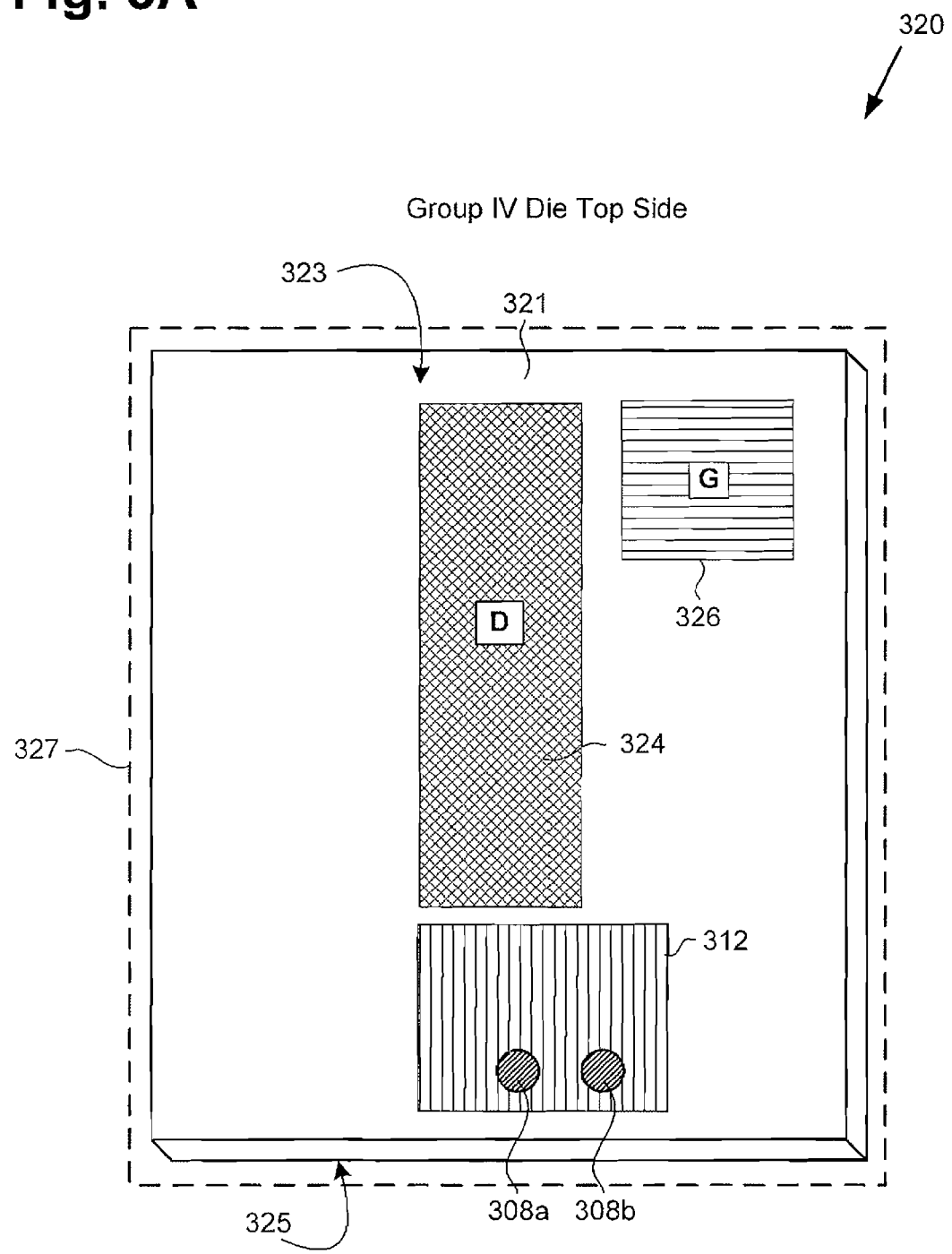
FIG. 3A presents a perspective view showing a top side of an exemplary group IV vertical transistor suitable for use in a stacked composite device, according to one implementation.

Moving to FIG. 3A, FIG. 3A presents a perspective view showing top side 323 of exemplary group IV vertical transistor 320 suitable for use in a stacked composite device, according to one implementation. As shown by FIG. 3A, group IV vertical transistor 320 includes active die 321, which may be formed of any suitable group IV semiconductor, and includes drain electrode 324, gate electrode 326, and gate bonding pad 312 for receiving a gate electrode of a stacked group III-V transistor (corresponding to gate electrode 216, in FIG. 2B), on top side 323 of active die 321. Also shown in FIG. 3A are top side termini of through-substrate vias 308a and 308b, such as through-silicon vias (TSVs) for example, electrically coupling gate bonding pad 312 to a source electrode of group IV vertical transistor 320 (source electrode not visible from the perspective of FIG. 3A) on bottom side 325 of active die 321. Group IV vertical transistor 320 may be implemented as a group IV vertical FET, such as a silicon vertical FET, for example. In addition, FIG. 3A shows lateral area 327 of active die 321. It is noted that lateral area 327 of active die 321 is greater than lateral area 217 of active die 211, in FIGS. 2A and 2B.

Figure 3B:
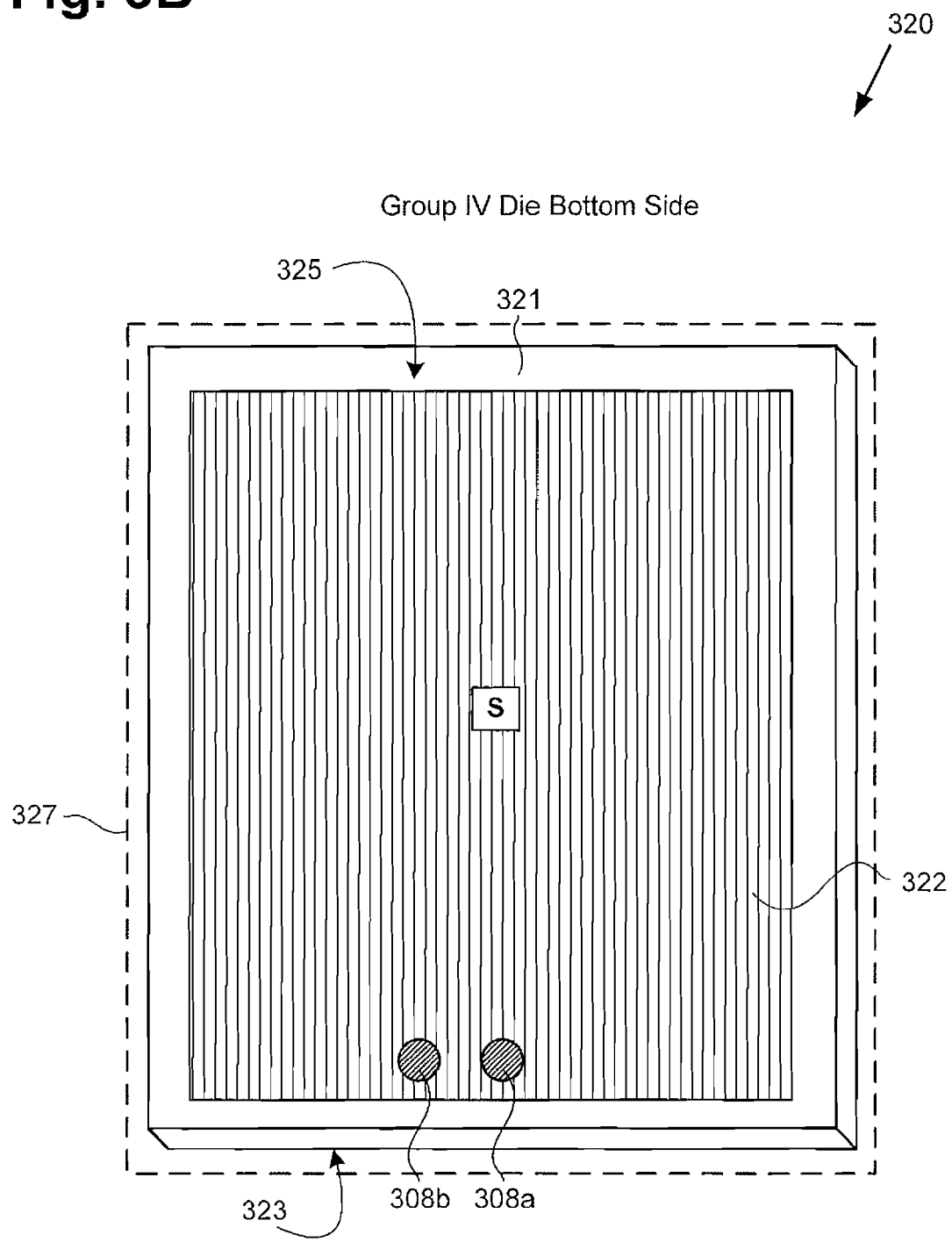
FIG. 3B presents a perspective view showing a bottom side of the exemplary group IV vertical transistor shown in FIG. 3A.

Continuing to FIG. 3B, FIG. 3B presents a perspective view showing bottom side 325 of exemplary group IV vertical transistor 320, consistent with the implementation shown by FIG. 3A. As shown by FIG. 3B, source electrode 322 of group IV vertical transistor 320 is formed on bottom side 325 active die 321. Also shown in FIG. 3B are bottom side termini of through-substrate vias 308a and 308b, corresponding respectively to the top side termini show in FIG. 3A. As was true for the representation shown in FIG. 2A, it is noted that although the top side termini of through-substrate vias 308a and 308b are visually depicted as "seen through" gate bonding pad 312 in the interests of conceptual clarity, in practice the top side termini of through-substrate vias 308a and 308b would be obscured by the presence of gate bonding pad 312 and thus would not be visible from the perspective view shown by FIG. 3A. Similarly, the bottom side termini of through-substrate vias 308a and 308b visually depicted as "seen through" source electrode 322 on bottom side 325 of active die 321 would be obscured by the presence of source electrode 322 and thus would not be visible from the perspective view shown by FIG. 3B.

Figure 4:
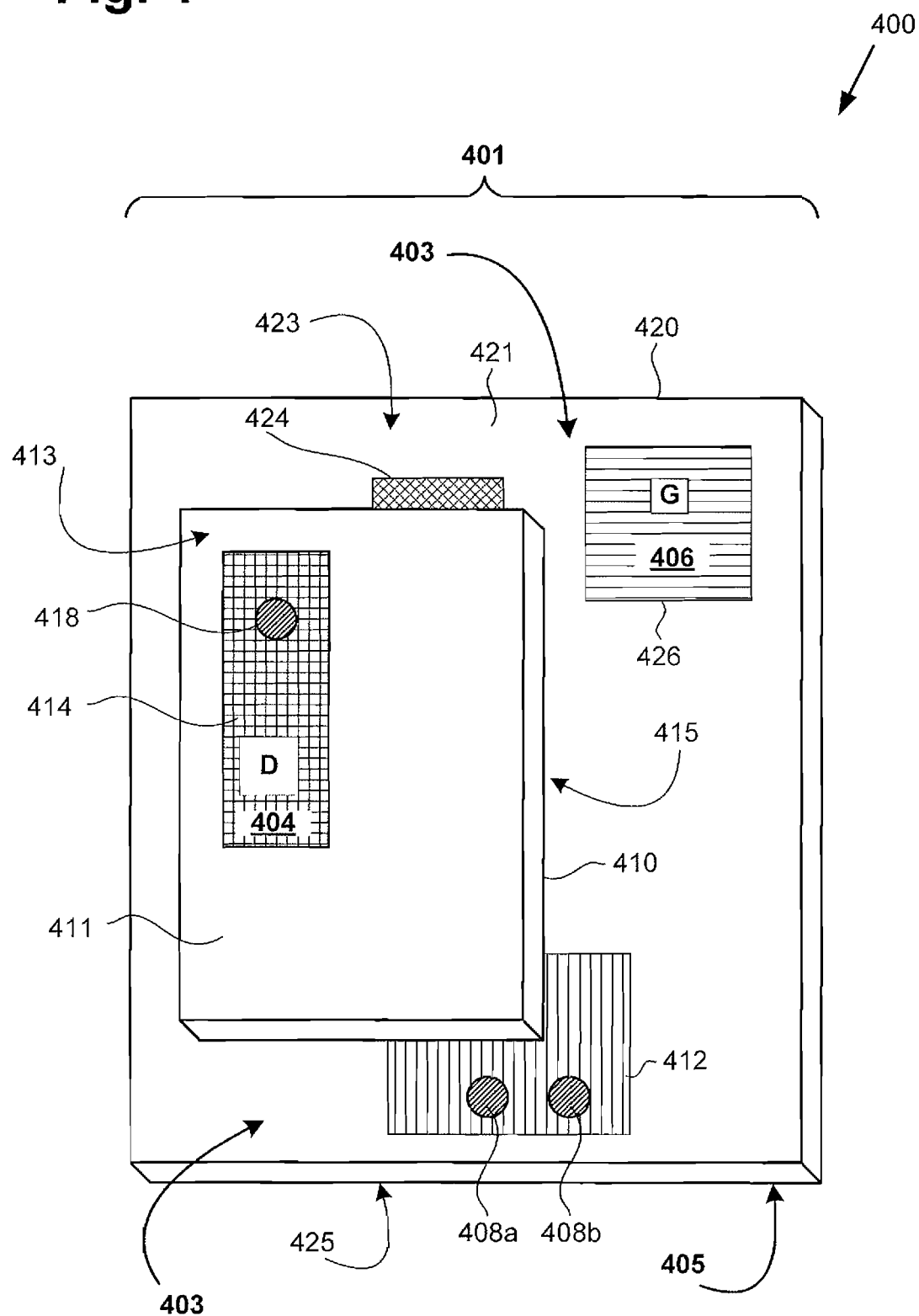
FIG. 4 presents a perspective view showing a top side of an exemplary stacked composite device implemented using the transistors shown by FIGS. 2A, 2B, 3A, and 3B.

Referring now to FIG. 4, FIG. 4 presents a perspective view showing a top side of a packaging solution including an exemplary stacked composite device, according to one implementation. As shown in FIG. 4, composite device package 400 includes stacked composite device 401 formed from group III-V transistor 410 stacked over and cascoded with group IV vertical transistor 420. It is noted that stacked composite device 401 corresponds to composite device 101, in FIG. 1. In addition, group III-V transistor 410 having back side 415, and drain electrode 414 including front side terminus of through-substrate via 418 on front side 413, corresponds to group III-V transistor 210, in FIGS. 2A and 2B. Consequently, the front side terminus of through-substrate via 418 depicted as "seen through" drain electrode 414 would in fact not be visible from the perspective of FIG. 4 due to its being overlaid by drain electrode 414.

Moreover, group IV vertical transistor 420 having drain electrode 424, gate electrode 426, and gate bonding pad 412 including the upper termini of through-substrate vias 408a and 408b on top side 423, and a source electrode (not visible from the perspective of FIG. 4) on bottom side 425, corresponds to group IV vertical transistor 320, in FIGS. 3A and 3B. Consequently, the top side termini of through-substrate vias 408a and 408b depicted as "seen through" gate bonding pad 412 would in fact not be visible from the perspective of FIG. 4 due to their being overlaid by gate bonding pad 412. It is further noted that insofar as group III-V transistor 410 corresponds to group III-V transistor 210 and group IV vertical transistor 420 corresponds to group IV vertical transistor 320, active die 421 of group IV vertical transistor 420 has a lateral area greater than a lateral area of active die 411 of group III-V transistor 410, as depicted in FIG. 4.

Stacked composite device 401 includes a composite source electrode (not visible from the perspective of FIG. 4), composite drain electrode 404, and composite gate electrode 406, corresponding respectively to composite source 102, composite drain 104, and composite gate 106 of composite device 101, in FIG. 1. As shown in FIG. 4, stacked composite device 401 includes group IV vertical transistor 420 and group III-V transistor 410 stacked over group IV vertical transistor 420. According to the implementation shown in FIG. 4, drain electrode 424 of group IV vertical transistor 420 is in contact with a source electrode on back side 415 of group III-V transistor 410 (corresponding to source electrode 212, in FIG. 2B). In addition, a source electrode on bottom side 425 of group IV vertical transistor 420 (corresponding to source electrode 322, in FIG. 3B) is coupled to a gate electrode on back side 415 of group III-V transistor 410 (corresponding to gate electrode 216, in FIG. 2B) to provide a composite source electrode (provided by source electrode 322, in FIG. 3B) on bottom side 405 of stacked composite device 401. Moreover, drain electrode 414 of group III-V transistor 410, which is electrically coupled to a drain pad on back side 415 of group III-V transistor 410 by through-substrate via 418, provides composite drain electrode 404 on top side 403 of stacked composite device 401, and gate electrode 426 of group IV vertical transistor 420 provides composite gate electrode 406 on top side 403 of stacked composite device 401.

In FIG. 4, stacked composite device 401 may be formed by stacking back side 415 of group III-V transistor 410 directly on top of drain electrode 424 and gate bonding pad 412 of group IV vertical transistor 420, for example. In that implementation, active die 411 can be aligned such that the source electrode of group III-V transistor 410 corresponding to source electrode 212 makes direct contact with drain electrode 424 of group IV vertical transistor 420, and such that the gate electrode of group III-V transistor 410 corresponding to gate electrode 216 makes direct contact with gate bonding pad 412 of group IV vertical transistor 420. In this implementation, the gate electrode of group III-V transistor 410 corresponding to gate electrode 216 is coupled to the source electrode of group IV vertical transistor 420 at bottom side 405 of stacked composite device 401 by gate bonding pad 412 and through-substrate vias 408a and 408b, which may be TSVs, as noted above. Moreover, the source electrode on bottom side 425 of group IV vertical transistor 420 and corresponding to source electrode 322, in FIG. 3B, can be coupled directly to the paddle of composite device package 400 (paddle not shown in FIG. 4).

With respect to the exemplary stacked composite device implementation shown in FIG. 4, the present inventors emphasize that the features and characteristics represented by that specific example are depicted in detail merely as a conceptual aid, and are not to be interpreted as limitations. It is noted that implementational details such as dimensions, and device layouts, for example, may be highly dependent upon the particular devices being utilized and the particular purpose for which the stacked composite device is designed. Consequently, the inventive principles illuminated by the specific example shown by FIG. 4 are capable of considerable implementational variation without departing from the scope of the inventive concepts disclosed herein.

Figure 5:
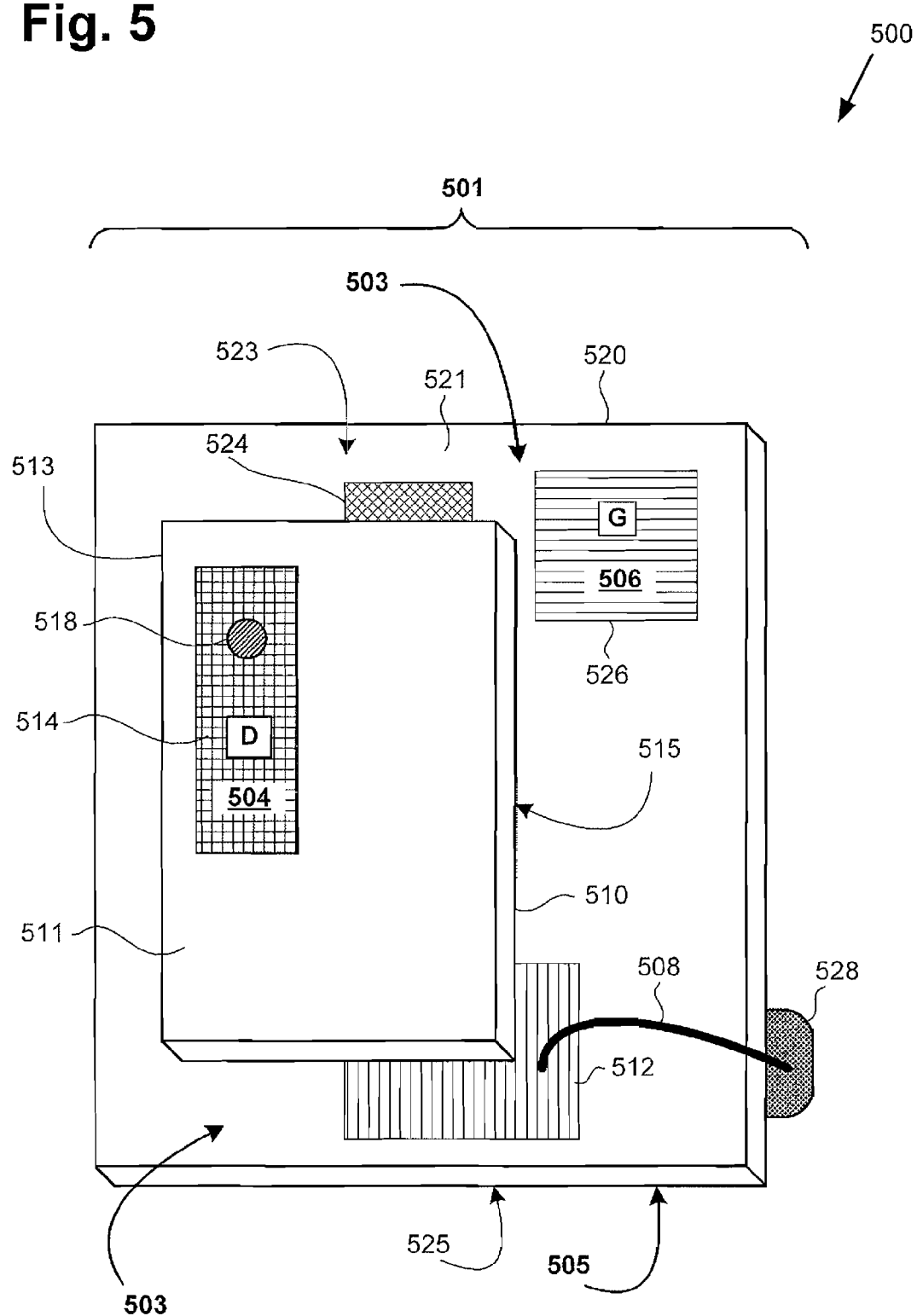
FIG. 5 presents a perspective view showing a top side of an exemplary stacked composite device, according to another implementation.

Moving to FIG. 5, FIG. 5 presents a perspective view showing a top side of a packaging solution including an exemplary stacked composite device, according to another implementation. As shown in FIG. 5, composite device package 500 includes stacked composite device 501 formed from group III-V transistor 510 stacked over and cascoded with group IV vertical transistor 520. It is noted that stacked composite device 501 corresponds to composite device 101, in FIG. 1. In addition, group III-V transistor 510 having back side 515, and drain electrode 514 including front side terminus of through-substrate via 518 on front side 513, corresponds to group III-V transistor 210, in FIGS. 2A and 2B, as well as to group III-V transistor 410, in FIG. 4. Thus, it is to be understood that although the front side terminus of through-substrate via 518 is visually depicted as "seen through" drain electrode 514 in the interests of conceptual clarity, in practice the front side terminus of through-substrate via 518 would be obscured by the presence of drain electrode 514 and thus would not be visible from the perspective shown by FIG. 5.

Group IV vertical transistor 520 having drain electrode 524, gate electrode 526, and gate bonding pad 512 on top side 523, and a source electrode (not visible from the perspective of FIG. 5) on bottom side 525, corresponds in general to group IV vertical transistor 320, in FIGS. 3A and 3B, as well as to group IV vertical transistor 420, in FIG. 4. However, it is noted that, unlike the implementation shown in FIGS. 3A, 3B, and 4, in the implementation of FIG. 5, gate bonding pad 512 is electrically coupled to the source electrode on bottom side 525 of group IV vertical transistor 520 by one or more bond wires 508 and conductive tab 528. It is further noted that insofar as group III-V transistor 510 corresponds to group III-V transistor 210 and group IV vertical transistor 520 corresponds in general to group IV vertical transistor 320, active die 521 of group IV vertical transistor 520 has a lateral area greater than a lateral area of active die 511 of group III-V transistor 510, as depicted in FIG. 5.

Stacked composite device 501 includes a composite source electrode (not visible from the perspective of FIG. 5), composite drain electrode 504, and composite gate electrode 506, corresponding respectively to composite source 102, composite drain 104, and composite gate 106 of composite device 101, in FIG. 1. As shown in FIG. 5, stacked composite device 501 includes group IV vertical transistor 520 and group III-V transistor 510 stacked over group IV vertical transistor 520. According to the implementation shown in FIG. 4, drain electrode 524 of group IV vertical transistor 520 is in contact with a source electrode on back side 515 of group III-V transistor 510 (corresponding to source electrode 212, in FIG. 2B). In addition, a source electrode on bottom side 525 group IV vertical transistor 520 (corresponding to source electrode 322, in FIG. 3B) is coupled to a gate electrode on back side 515 of group III-V transistor 510 (corresponding to gate electrode 216, in FIG. 2B) to provide a composite source electrode (provided by source electrode 322, in FIG. 3B) on bottom side 505 of composite device package 500. Moreover, drain electrode 514 of group III-V transistor 510, which is electrically coupled to a drain pad on back side 415 of group III-V transistor 410 by through-substrate via 418, provides composite drain electrode 504 on top side 503 of composite device package 500, and gate electrode 526 of group IV vertical transistor 520 provides composite gate electrode 506 on top side 503 of composite device package 500.

In FIG. 5, stacked composite device 501 may be formed by stacking back side 515 of group III-V transistor 510 directly on top of drain electrode 524 and gate bonding pad 512 of group IV vertical transistor 520, for example. In that implementation, active die 511 can be aligned such that the source electrode of group III-V transistor 510 corresponding to source electrode 212 makes direct contact with drain electrode 524 of group IV vertical transistor 520, and such that the gate electrode of group III-V transistor 510 corresponding to gate electrode 216 makes direct contact with gate bonding pad 512 of group IV vertical transistor 520. In this implementation, the gate electrode of group III-V transistor 510 corresponding to gate electrode 216 is coupled to the source electrode of group IV vertical transistor 520 at bottom side 505 of stacked composite device 501 by gate bonding pad 512, one or more bond wires 508, and conductive tab 528.

Although in the present implementation, gate bonding pad 512 is shown to be coupled to the source electrode on bottom side 525 of group IV vertical transistor 520 through one or more bond wires 508, such as gold (Au) or copper (Cu) bond wires, for example, in other implementations one or more bond wires 508 may be replaced by conductive ribbons, conductive metal clips, or other connectors comprising conductive materials such as Al, Au, Cu, and/or other metals or composite materials. It is reiterated that the features and characteristics represented by the specific example shown in FIG. 5 are depicted in detail merely as a conceptual aid, and are not to be interpreted as limitations.

Stacking of group III-V transistor 410/510 on top of group IV vertical transistor 420/520 may be achieved using, for example, solder, conductive adhesive, conductive tape, sintering, or other attachment methods, resulting in formation of a direct mechanical contact between group IV vertical transistor 420/520 and group III-V transistor 410/510. Such direct attachment of group IV vertical transistor 420/520 to group III-V transistor 410/510 can advantageously reduce parasitic inductance and resistance, improve thermal dissipation, and reduce form factor and manufacturing cost compared to conventional packaging solutions. To improve thermal dissipation even further, active die 411/511 of group III-V transistor 410/510 and/or active die 421/521 of group IV vertical transistor 420/520 may be thinned so as to have a die thickness in a range from approximately thirty microns (30 μm) to approximately sixty microns (60 μm) to enhance thermal conductivity.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A stacked composite device having a composite drain, a composite source, and a composite gate, said stacked composite device comprising:
   a group IV vertical transistor in a first active die;
   a group III-V transistor in a second active die stacked over said group IV vertical transistor, said group III-V transistor having a drain electrode on a front side of said second active die coupled to a drain on a back side of said second active die by a through-substrate via;
   a drain electrode of said group IV vertical transistor on a top side of said group IV vertical transistor being in direct contact with a source electrode of said group III-V transistor on said back side of said second active die, said source electrode of said group III-V transistor situated on said drain electrode of said group IV vertical transistor;
   a source of said group IV vertical transistor on a bottom side of said group IV vertical transistor being coupled to a gate of said group III-V transistor to provide said composite source on a bottom side of said stacked composite device;
   said drain electrode of said group III-V transistor providing said composite drain on a top side of said stacked composite device;
   a gate of said group IV vertical transistor providing said composite gate on said top side of said stacked composite device.

2. The stacked composite device of claim 1, wherein said source of said group IV vertical transistor on said bottom side of said group IV vertical transistor is coupled to said gate of said group III-V transistor through at least one through-silicon via (TSV).

3. The stacked composite device of claim 1, wherein said source of said group IV vertical transistor on said bottom side of said group IV vertical transistor is coupled to said gate of said group transistor through at least one bond wire.

4. The stacked composite device of claim 1, wherein said group III-V transistor is a normally ON device and said stacked composite device is a normally OFF device.

5. The stacked composite device of claim 1, wherein said group III-V transistor is a high-voltage transistor and said group IV vertical transistor is a low-voltage transistor.

6. The stacked composite device of claim 1, wherein at least one of a die of said group IV vertical transistor and a die of said group III-V transistor has a thickness of less than approximately 60 µm.

7. The stacked composite device of claim 1, wherein group IV vertical transistor comprises silicon.

8. A composite device package comprising:
   a group IV vertical transistor in a first active die;
   a group III-V transistor stacked over said group IV vertical transistor in a second active die, a lateral area of said first active die being greater than a lateral area of said second active die, said group III-V transistor having a drain electrode on a front side of said second active die coupled to a drain on a back side of said second active die by a through-substrate via;
   a drain electrode of said group IV vertical transistor on a top side of said group IV vertical transistor being in direct contact with a source electrode of said group III-V transistor on said back side of said second active die, said source electrode of said group III-V transistor situated on said drain electrode of said group IV vertical transistor;
   a source of said group IV vertical transistor on a bottom side of said group IV vertical transistor being coupled to a gate of said group III-V transistor to provide a composite source on a bottom side of said composite device package;
   said drain electrode of said group III-V transistor providing a composite drain on a top side of said composite device package;
   a gate of said group IV vertical transistor providing a composite gate on said top side of said composite device package.

9. The composite device package of claim 8, wherein said source of said group IV vertical transistor on said bottom side of said group IV vertical transistor is coupled to said gate of said group III-V transistor through at least one through-silicon via (TSV).

10. The composite device package of claim 8, wherein said source of said group IV vertical transistor on said bottom side of said group IV vertical transistor is coupled to said gate of said group III-V transistor through at least one bond wire.

11. The composite device package of claim 8, wherein said group III-V transistor is a normally ON device and a composite device formed of said group III-V transistor and said group IV vertical transistor is a normally OFF device.

12. The composite device package of claim 8, wherein said group III-V transistor is a high-voltage transistor and said group IV vertical transistor is a low-voltage transistor.

13. The composite device package of claim 8, wherein at least one of said first active die and said second active die has a thickness of less than approximately 60 µm.

14. The composite device package of claim 8, wherein said group IV vertical transistor comprises silicon.

15. A stacked composite device having a composite drain, a composite source, and a composite gate, said stacked composite device comprising:
   a silicon vertical FET in a first active die;
   a III-Nitride transistor in a second active die stacked over said silicon vertical FET, said III-Nitride transistor having a drain electrode on a front side of said second active die coupled to a drain on a back side of said second active die by a through-substrate via;
   a drain electrode of said silicon vertical FET on a top side of said silicon vertical FET being in direct contact with a source electrode of said III-Nitride transistor on said back side of said second active die, said source electrode of said III-Nitride transistor situated on said drain electrode of said silicon vertical FET;
   a source of said silicon vertical FET on a bottom side of said silicon vertical FET being coupled to a gate of said III-Nitride transistor to provide said composite source on a bottom side of said stacked composite device;
   said drain electrode of said III-Nitride transistor providing said composite drain on a top side of said stacked composite device;
   a gate of said silicon vertical FET providing said composite gate on said top side of said stacked composite device.

16. The stacked composite device of claim 15, wherein said source of said silicon vertical FET on said bottom side of said silicon vertical FET is coupled to said gate of said III-Nitride transistor through at least one through-silicon via (TSV).

17. The stacked composite device of claim 15, wherein said source of said silicon vertical FET on said bottom side of said silicon vertical FET is coupled to said gate of said III-Nitride transistor through at least one bond wire.

18. The stacked composite device of claim 15, wherein said III-Nitride transistor is a normally ON device and said stacked composite device is a normally OFF device.

19. The stacked composite device of claim 15, wherein said III-Nitride transistor is a high-voltage transistor and said silicon vertical FET is a low-voltage transistor.

20. The stacked composite device of claim 15, wherein said III-Nitride transistor comprises gallium nitride (GaN).

* * * * *